(12) United States Patent
Park et al.

(10) Patent No.: US 6,979,956 B2
(45) Date of Patent: Dec. 27, 2005

(54) ORGANIC ELECTROLUMINESCENT DEVICE HAVING BACKUP DRIVING UNIT

(75) Inventors: Jae-Yong Park, Gyeonggi-do (KR); Nam-Yang Lee, Gyeonggi-do (KR); Juhn-Suk Yoo, Seoul (KR); In-Jae Chung, Gyeonggi-do (KR)

(73) Assignee: LG.Philips LCD Co., Ltd., (KR)

( * ) Notice: Subject to any disclaimer, the term of this patent is extended or adjusted under 35 U.S.C. 154(b) by 0 days.

(21) Appl. No.: 10/609,025

(22) Filed: Jun. 30, 2003

(65) Prior Publication Data

US 2004/0066146 A1  Apr. 8, 2004

(30) Foreign Application Priority Data

Jul. 16, 2002  (KR) ...................... 10-2002-0041612

(51) Int. Cl.[7] ............................ G09G 3/10; G09G 3/36
(52) U.S. Cl. ..................................... 315/169.3; 345/92
(58) Field of Search .................... 315/169.3, 169.2, 315/169.1, 169.4; 345/36, 45, 76, 92

(56) References Cited

U.S. PATENT DOCUMENTS

| | | | |
|---|---|---|---|
| 6,236,064 B1 * | 5/2001 | Mase et al. | 257/72 |
| 6,528,950 B2 * | 3/2003 | Kimura | 315/169.3 |
| 6,611,248 B2 * | 8/2003 | Kanbara et al. | 345/100 |
| 6,713,783 B1 * | 3/2004 | Mase et al. | 257/59 |
| 6,753,656 B2 * | 6/2004 | Kimura | 315/169.3 |

* cited by examiner

*Primary Examiner*—Trinh Vo Dinh
(74) *Attorney, Agent, or Firm*—Morgan Lewis & Bockius LLP

(57) ABSTRACT

An organic electroluminescent device of the present invention includes: a gate line and a data line formed over a substrate, the gate and data lines perpendicularly crossing each other and defining a pixel therebetween; a first driving unit formed in the pixel and comprised of a first switching TFT and a first driving TFT; a power line delivering a current signal to the first driving TFT; an organic electroluminescent diode contacting the first driving TFT and receiving the current signal from the first driving TFT; and a second driving unit formed in the pixel and comprised of a second switching TFT and a second driving TFT, the second driving unit being a backup circuit that can deliver the current signal from the power line to the organic electroluminescent diode when the first driving unit malfunctions.

26 Claims, 5 Drawing Sheets

ORGANIC ELECTROLUMINESCENT DEVICE HAVING BACKUP DRIVING UNIT

The present application claims the benefit of Korean Patent Application No. 2002-0041612, filed on Jul. 16, 2002 in Korea, which is hereby incorporated by reference.

BACKGROUND OF THE INVENTION

1. Field of the Invention

The present invention relates to an organic electroluminescent display device, and more particularly, to a dual plate organic electroluminescent device that includes a first substrate having a thin film transistor array unit, the thin film transistors arranged in a way that prevents point defects, such as dark spots, from occurring in the organic electroluminescent display device.

2. Discussion of the Related Art

An organic electroluminescent display device includes a cathode electrode injecting electrons, an anode electrode injecting holes, and an organic electroluminescent layer between the two electrodes. An organic electroluminescent diode has a multi-layer structure of organic thin films provided between the anode electrode and the cathode electrode. When a forward current is applied to the organic electroluminescent diode, electron-hole pairs (often referred to as excitons) combine in the organic electroluminescent layer as a result of a P-N junction between the anode electrode, which injection holes, and the cathode electrode, which injects electrons. The electron-hole pairs have a lower energy when combined together than when they were separated. The resultant energy gap between the combined and separated electron-hole pairs is converted into light by an organic electroluminescent element. In other words, the organic electroluminescent layer emits the energy generated due to the recombination of electrons and holes in response to an applied current.

As a result of the above-described principles, the organic electroluminescent device does not need an additional light source as compared with a liquid crystal display device. Moreover, the electroluminescent device is thin, light weight, and is very energy efficient. As a result, the organic electroluminescent device has excellent advantages when displaying images, such as a low power consumption, a high brightness, and a short response time. Because of these advantageous characteristics, the organic electroluminescent device is regarded as a promising candidate for various next-generation consumer electronic appliances, such as mobile communication devices, PDAs (personal digital assistances), camcorders, and palm PCs. Also, because the fabricating of such organic electroluminescent devices is a relatively simple process, it is much cheaper to produce an organic electroluminescent device than a liquid crystal display device.

The organic electroluminescent display devices may be provided in either a passive matrix type arrangement or an active matrix type arrangement. The passive matrix type has a simple structure and fabrication process, but has a high power consumption when compared with the active matrix type. Further, because the display size of passive matrix organic electroluminescent display devices is limited by its structure, the passive matrix type can not easily be adapted to a device that is large in size. Moreover, the passive matrix type has a decreasing aperture ratio as the bus lines increase. On the contrary, the active matrix type organic electroluminescent display devices provide a higher display quality with higher luminosity when compared with the passive matrix type.

FIG. 1 is a schematic cross-sectional view illustrating an active matrix type organic electroluminescent display device according to a related art arrangement. As shown in FIG. 1, an organic electroluminescent display device 10 includes first and second substrates 12 and 28 which are attached to each other by a sealant 26. On the first substrate 12, a plurality of thin film transistors (TFTs) T and array portions 14 are formed. A first electrode (i.e., an anode electrode) 16, an organic luminous layer 18 and a second electrode (i.e., a cathode electrode) 20 are sequentially formed on the array portion 14. At this point, the organic luminous layer 18 emits red (R), green (G) or blue (B) color in each pixel P. In particular, to show color images, organic color luminous patterns are disposed respectively in each pixel P.

As additionally shown in FIG. 1, the second substrate 28, which is attached to the first substrate 12 by the sealant 26, includes a moisture absorbent 22 on the rear surface thereof. The moisture absorbent 22 absorbs the moisture that may exist in the cell gap between the first and second substrates 12 and 28. When disposing the moisture absorbent 22 in the second substrate 28, a portion of the second substrate 28 is etched to form a dent. Thereafter, the powder-type moisture absorbent 22 is disposed into this dent and then a sealing tape 25 is put on the second substrate 28 to fix the powder-type moisture absorbent 22 into the dent.

FIG. 2 is an equivalent circuit diagram illustrating a pixel of the organic electroluminescent display device according to a related art arrangement. As shown in FIG. 2, a gate line 30 is disposed in a transverse direction and a data line 32 is disposed in a longitudinal direction substantially perpendicular to the gate line 30. A switching thin film transistor (switching TFT) $T_S$ is disposed in a crossing of the gate and data lines 30 and 32 and a driving thin film transistor (driving TFT) $T_D$ is disposed electrically connecting with the switching thin film transistor $T_S$. The driving TFT $T_D$ is electrically connected with an organic electroluminescent diode E. A storage capacitor $C_{ST}$ is constituted between gate 40 and source 42 of the driving TFT $T_D$. The organic electroluminescent diode E is comprised of a first electrode, an organic luminous layer and a second electrode, as described in FIG. 1. The first electrode of the organic electroluminescent diode E electrically contacts with a drain 46 of the driving TFT $T_D$, the organic luminous layer is disposed on the first electrode, and the second electrode is disposed on the organic luminous layer.

Now, an operation of the organic electroluminescent display device will be explained briefly with reference to FIG. 2. When a gate signal is applied to a gate 36 of the switching TFT $T_S$ from the gate line 30, a data current signal flowing via the data line 32 is converted into a voltage signal by the switching TFT $T_S$ and then this voltage signal is applied to the gate 40 of the driving TFT $T_D$. Thereafter, the driving TFT $T_D$ is operated and then determines current level that flows through the organic electroluminescent diode E. As a result, the organic electroluminescent diode E can display a gray scale between black and white.

The voltage signal is also applied to the storage capacitor $C_{ST}$ such that a charge is stored in the storage capacitor $C_{ST}$. The charge stored in the storage capacitor $C_{ST}$ maintains the voltage of the voltage signal on the gate 40 of the driving TFT $T_D$. Thus, although the switching TFT $T_S$ is turned off, the current level flowing to the organic electroluminescent diode E remains constant until the next voltage signal is applied.

Under different circumstances, the above-mentioned organic electroluminescent display device can have plural driving and switching TFTs. For example, the organic electroluminescent display device can have four TFTs, i.e., a four TFT structure. More particularly, the organic electroluminescent display device can have two parallel-connected switching TFTs and two parallel-connected driving TFTs within one pixel. When the organic electroluminescent display device is provided with two switching TFTs, the stress resulting from the continuously applied DC bias decreases to some extent. Generally, the driving TFT can deteriorate as a result of persistent stress from the applied current. As a result, the operating characteristics of the driving TFT can vary severely. To overcome this problem, two driving TFTs can be provided within the pixel in a parallel connection to each other. This results in a prolonged life span of the driving TFT.

FIG. 3 is an equivalent circuit diagram illustrating one pixel of an organic electroluminescent display device having a four TFT structure. As shown, a gate line 52 is disposed over a substrate 50 in a transverse direction, and a data line 54 is disposed in a longitudinal direction substantially perpendicular to the gate line 52. A first switching TFT $T_{S1}$ and a second switching TFT $T_{S2}$ are disposed near a crossing of the gate and data lines 52 and 54. Further, in a pixel defined by the gate and data lines 52 and 54, there are first and second driving TFTs $T_{D1}$ and $T_{D2}$ which are electrically connected with the first and second switching TFTs $T_{S1}$ and $T_{S2}$. Gates 58 and 64 of the first and second switching TFTs $T_{S1}$ and $T_{S2}$ are both connected to the gate line 52. Source 60 of the first switching TFT $T_{S1}$ is connected to the data line 54. Drain 62 of the first switching TFT $T_{S1}$ is connected with source 66 of the second switching TFT $T_{S2}$. The drain 62 and the source 66 are formed together as a monolithic structure of single piece. Gates 70 and 71 of the first and second driving TFTs $T_{D1}$ and $T_{D2}$ are also formed together as a monolithic structure of single piece and connected to the drain 67 of the second switching TFT $T_{S2}$. Drain 72 of the second driving TFT $T_{D2}$ is connected to both the drain 62 of the first switching TFT $T_{S1}$ and the source 66 of the second switching TFT $T_{S2}$. Sources 76 and 74 of the first and second driving TFTs $T_{D1}$ and $T_{D2}$ are connected to the power line 56. A storage capacitor $C_{ST}$ is formed between the gates 70 and 71 and the sources 76 and 74 of the first and second driving TFTs $T_{D1}$ and $T_{D2}$. The drain 78 of the first driving TFT $T_{D1}$ is connected with an organic electroluminescent diode E.

The above-described organic electroluminescent device having a four TFT structure operates like the organic electroluminescent device having a two TFT structure. However, in the organic electroluminescent device of FIG. 3 having a four TFT structure, the data signal is divided when applied to the parallel-connected TFTs. In particular, the data current signal of the data line 54 can flow through the first and second switching TFTs $T_{S1}$ and $T_{S2}$, dividedly. Then, the first and second switching TFTs $T_{S1}$ and $T_{S2}$ drive both the first and second driving TFTs $T_{D1}$ and $T_{D2}$. Thereafter, a current signal flowing in the power line 56 is delivered to the organic electroluminescent diode E through the first driving TFT $T_{D1}$, thereby emitting light.

The related art organic electroluminescent display device having the two TFT structure or the four TFT structure frequently results in point defects, such as dark spots, being displayed. Since the organic electroluminescent display device is very thin, for example, often having a thickness of 1000 angstroms, the organic electroluminescent display device may be broken, resulting in these dark spots appearing in the displayed images. Furthermore, such point defects typically arise as a result of malfunctions of the thin film transistors within the pixel. For example, if the switching and driving TFTs improperly operate within the pixel, the pixel having the malfunctioning TFT can be erroneously displayed as a dark spot.

SUMMARY OF THE INVENTION

Accordingly, the present invention is directed to an organic electroluminescent display device which substantially obviates one or more of the problems due to limitations and advantages of the related art.

An object of the present invention is to provide an organic electroluminescent display device having stable structure elements, resulting in a prolonged operational life span.

Another object of the present invention is to provide an organic electroluminescent display device having a stable structure that prevents point defects, thereby providing high resolution and picture quality.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, an organic electroluminescent device includes a gate line and a data line formed over a substrate, the gate and data lines perpendicularly crossing each other and defining a pixel therebetween; a first driving unit formed in the pixel and comprised of a first switching TFT and a first driving TFT; a power line delivering a current signal to the first driving TFT; an organic electroluminescent diode contacting the first driving TFT and receiving the current signal from the first driving TFT; and a second driving unit formed in the pixel and comprised of a second switching TFT and a second driving TFT, the second driving unit being a backup circuit that can deliver the current signal from the power line to the organic electroluminescent diode when the first driving unit malfunctions.

In another aspect, an organic electroluminescent device includes a gate line and a data line formed over a substrate, the gate and data lines perpendicularly crossing each other, and defining a pixel therebetween; a first driving unit formed in the pixel and comprised of first and second switching TFTs and first and second driving TFTs; a power line delivering a current signal to the first driving TFT; an organic electroluminescent diode contacting the first driving TFT and receiving the current signal from the first driving TFT and a second driving unit formed in the pixel and comprised of third and fourth switching TFTs and third and fourth driving TFTs, the second driving unit being a backup circuit that can deliver the current signal from the power line to the organic electroluminescent diode when the first driving unit malfunctions.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Reference will now be made in detail to the illustrated embodiments of the present invention, examples of which are illustrated in the accompanying drawings.

Figure 1:
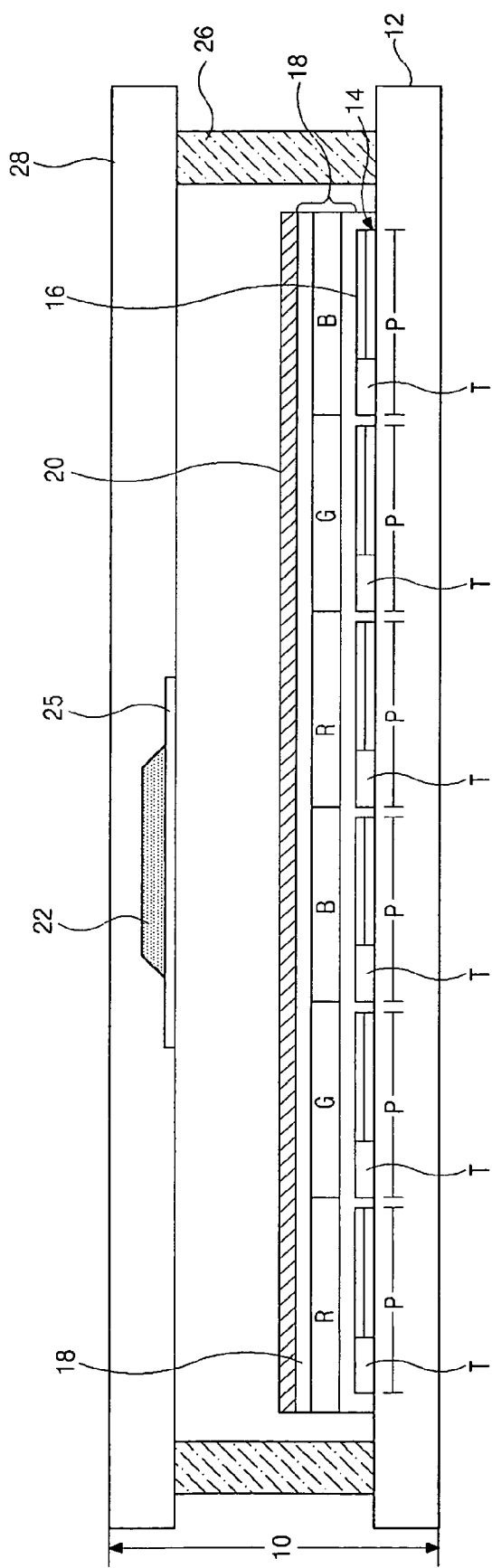
FIG. 1 is a schematic cross-sectional view illustrating an active matrix type organic electroluminescent display device according to a related art arrangement.
Figure 2:
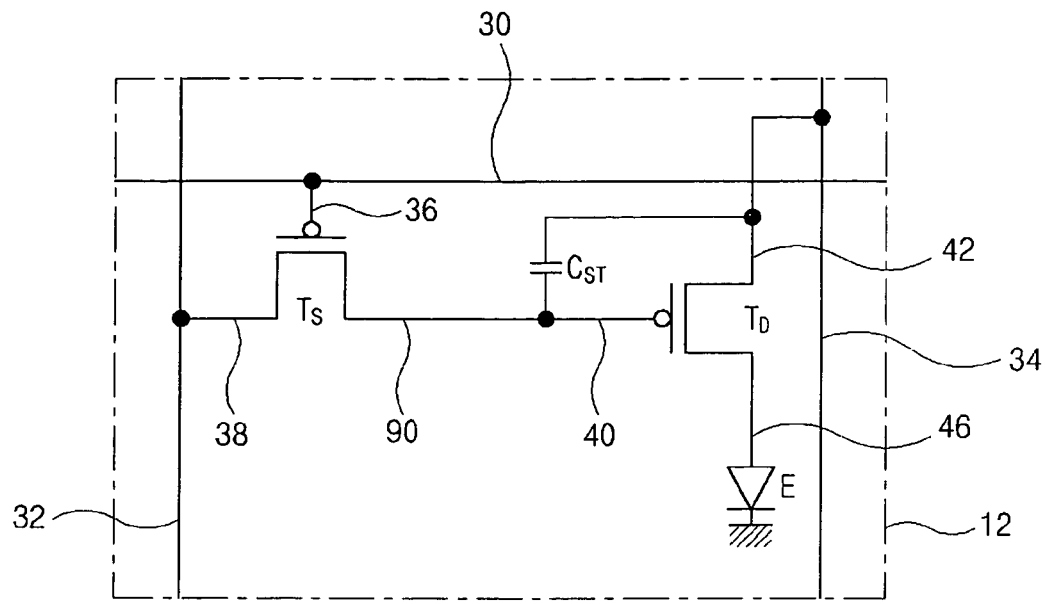
FIG. 2 is an equivalent circuit diagram illustrating a pixel of the organic electroluminescent display device according to the related art arrangement.
Figure 3:
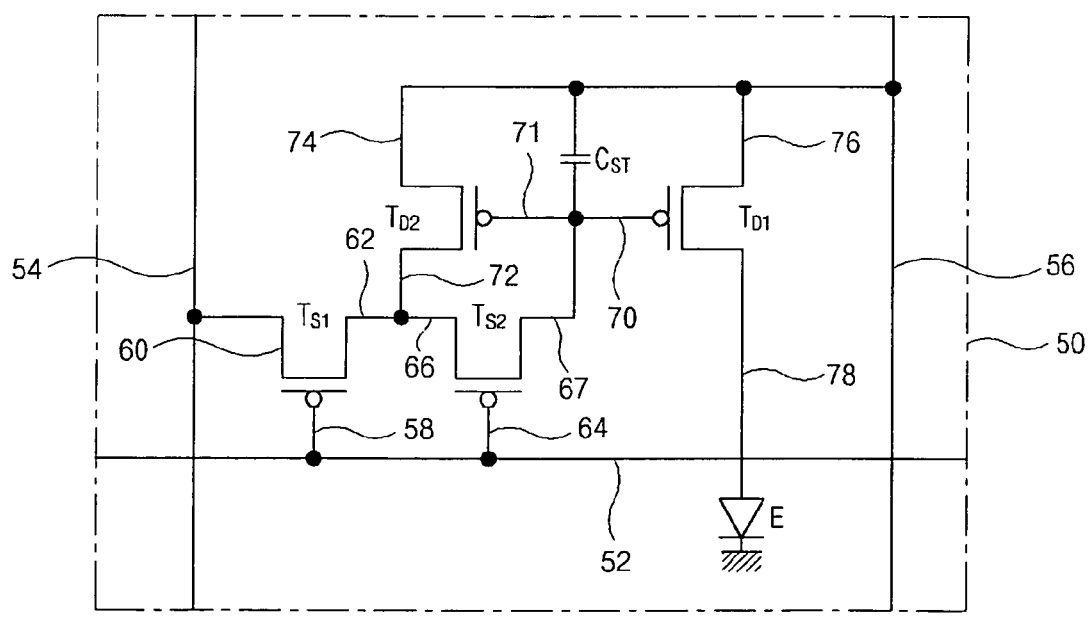
FIG. 3 is an equivalent circuit diagram illustrating one pixel of an organic electroluminescent display device having a four TFT structure according to a related art arrangement.
Figure 4:
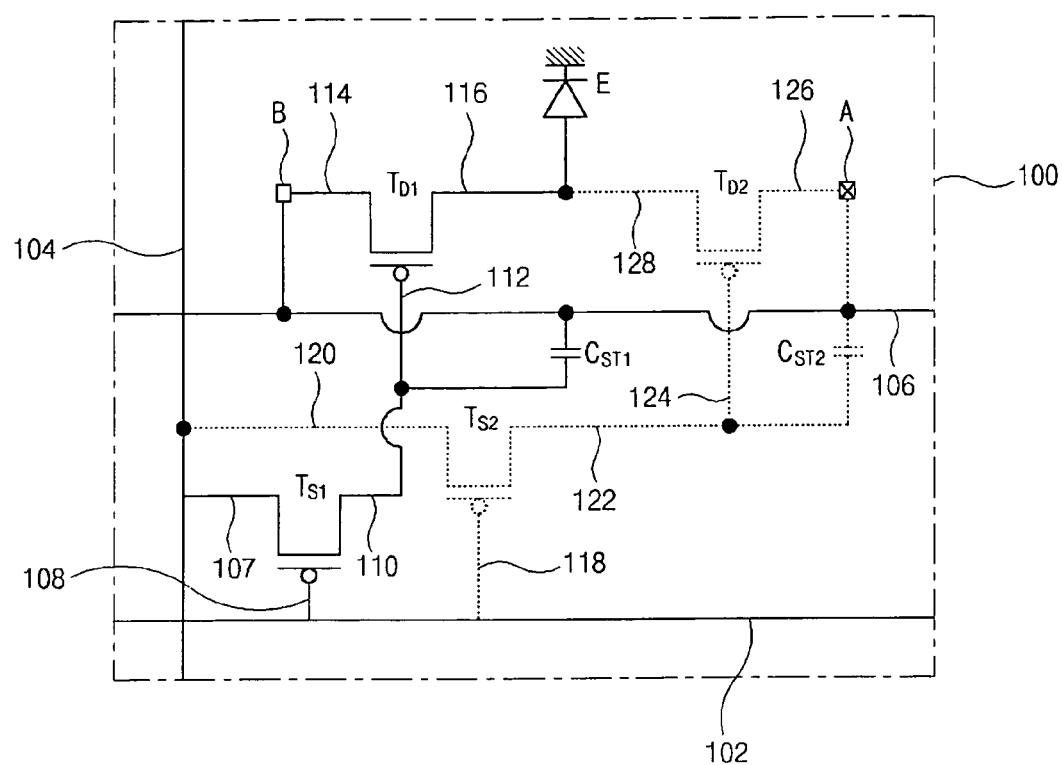
FIG. 4 is an equivalent circuit diagram illustrating a pixel of an organic electroluminescent display device according to a first embodiment of the present invention.

FIG. 4 is an equivalent circuit diagram illustrating a pixel of an organic electroluminescent display device according to a first embodiment of the present invention. Hereinafter in the present invention, a first switching TFT $T_{S1}$ and a first driving TFT $T_{D1}$ are referred to as a first driving unit, and a second switching TFT $T_{S2}$ and a second driving TFT $T_{D2}$ are referred to as a second driving unit. The first driving unit is electrically independent from the second driving unit.

Referring to FIG. 4, the first driving unit will be explained first. Gate and data lines 202 and 104 are disposed over a substrate 100. The gate line 102 is located in a transverse direction, and the data line 104 is located in a longitudinal direction substantially perpendicular to the gate line 102. A gate 108 of the first switching TFT $T_{S1}$ is connected to the gate line 102, and a source 107 of the first switching TFT $T_{S1}$ is connected to the data line 104. Further, a drain 110 of the first switching TFT $T_{S1}$ is connected to a gate 112 of the first driving TFT $T_{D1}$. A source 114 of the first driving TFT $T_{D1}$ is connected to a power line 106, and a drain 116 of the first driving TFT $T_{D1}$ is connected to an organic electroluminescent diode E. A first storage capacitor $C_{ST1}$ is formed between the gate 112 and the source 114 of the first driving TFT $T_{D1}$. For example, the first storage capacitor $C_{ST1}$ substantially comprises the gate 112 and the power line 106.

When the first switching TFT $T_{S1}$ is turned on, the first driving TFT $T_{D1}$ is also turned on and then a current signal flowing the power line 106 is delivered to the organic electroluminescent diode E through the first driving TFT $T_{D1}$. As a result, the organic electroluminescent diode E emits light.

The second driving unit will now be explained with reference to FIG. 4. A gate 118 of the second switching TFT $T_{S2}$ is connected to the gate line 102, and a source 120 of the second switching TFT $T_{S2}$ is connected to the data line 104. Further, a drain 122 of the second switching TFT $T_{S2}$ is connected to a gate 124 of the second driving TFT $T_{D2}$. A source 126 of the second driving TFT $T_{D2}$ is connected to a power line 106, and a drain 128 of the second driving TFT $T_{D2}$ is connected to an organic electroluminescent diode E. A second storage capacitor $C_{ST2}$ is formed between the gate 124 and the source 126 of the second driving TFT $T_{D2}$. For example, the second storage capacitor $C_{ST2}$ substantially comprises the gate 124 and the power line 106.

The second driving unit comprised of the second switching and driving TFTs $T_{S2}$ and $T_{D2}$ is actually a backup circuit that does not operate when the organic electroluminescent diode E emits light by the proper operation of the first driving unit (first switching and driving TFTs $T_{S1}$ and $T_{D1}$). Therefore, an open portion A exists between the power line 106 and the source 126 of the second driving TFT $T_{D2}$. This open portion A is opened at the first stage of fabricating the organic electroluminescent display device. Therefore, although the second switching TFT $T_{S2}$ applies the signal to the second driving TFT $T_{D2}$, the power line signal flowing in the power line 106 does not influence the organic electroluminescent diode E because of the open portion A.

On the contrary, when the first driving unit has some defects and malfunctions, the open portion A is closed by welding or the like to connect the power line 106 to the second driving TFT $T_{D2}$ and then the second driving unit operates instead of the first driving unit. At this time, a portion B between the power line 106 and the first driving TFT $T_{D1}$ is opened to surely disconnect the first driving TFT $T_{D1}$ from the power line 106, and thus the organic electroluminescent diode E is not influenced by the first driving unit.

When the second driving unit operates instead of the first driving unit, the second switching TFT $T_{S2}$ is turned on and the second driving TFT $T_{D2}$ is also turned on, thereby delivering a current signal flowing the power line 106 to the organic electroluminescent diode E through the second driving TFT $T_{D2}$. Therefore, the organic electroluminescent diode E emits light.

The reason for opening the portion B between the power line 106 and the first driving TFT $T_{D1}$ is to stably supply the power line signal from the power line 106 to the organic electroluminescent diode E. If the portion B is not cut, the power line signal may flow into the organic electroluminescent diode E through the first driving TFT $T_{D1}$ and then deteriorate the image quality of the organic electroluminescent display device. Accordingly, when the second driving unit replaces the first driving unit with the open portion A closed by welding or the like, the portion B between the power line 106 and the first driving TFT $T_{D1}$ is opened.

Figure 5:
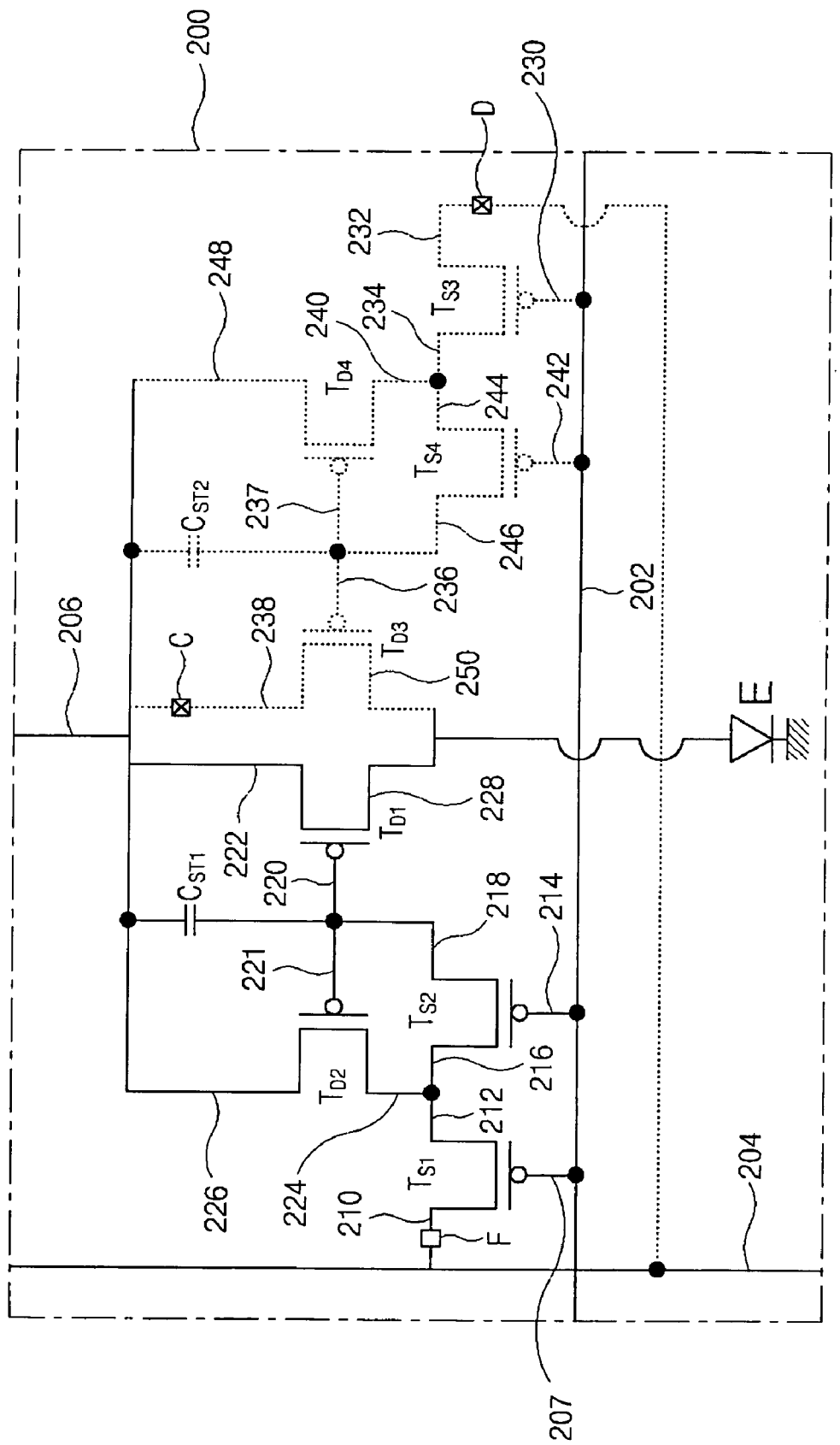
FIG. 5 is an equivalent circuit diagram illustrating a pixel of an organic electroluminescent display device according to a second embodiment of the present invention.

FIG. 5 is an equivalent circuit diagram illustrating a pixel of an organic electroluminescent display device according to a second embodiment of the present invention. As shown, gate and data lines 202 and 204 are formed over a substrate 200. The gate line 202 is disposed in a transverse direction, and the data line 204 is disposed in a longitudinal direction substantially perpendicular to the gate line 202.

As shown in FIG. 5, the pixel according to the second embodiment of the present invention includes a first driving unit that is disposed in a crossing of the gate and data lines 202 and 204. The first driving unit is comprised of parallel-connected first and second switching TFTs $T_{S1}$ and $T_{S2}$ and parallel-connected first and second driving TFTs $T_{D1}$ and $T_{D2}$. The first and second switching TFTs $T_{S1}$ and $T_{S2}$ are electrically connected to the first and second driving TFTs $T_{D1}$ and $T_{D2}$. The pixel of the second embodiment also includes a second driving unit that is comprised of parallel-connected third and fourth switching TFTs $T_{S3}$ and $T_{S4}$ and parallel-connected third and fourth driving TFTs $T_{D3}$ and $T_{D4}$. The third and fourth switching TFTs $T_{S3}$ and $T_{S4}$ are electrically connected to the third and fourth driving TFTs $T_{D3}$ and $T_{D4}$. As mentioned before, the second driving unit is electrically independent from the first driving unit.

In the first driving unit of FIG. 5, a gate 207 of the first switching TFT $T_{S1}$ and a gate 214 of the second switching TFT $T_{S2}$ are both connected to the gate line 202. A source 210 of the first switching TFT $T_{S1}$ is connected to the data line 204 and a drain 212 of the first switching TFT $T_{S1}$ is connected to a source 216 of the second switching TFT $T_{S2}$. The drain 212 and the source 216 are formed together as a monolithic structure of single piece. A gate 220 of the first driving TFT $T_{D1}$ and a gate 221 of the second driving TFT $T_{D2}$ are connected to the drain 218 of the second switching TFT $T_{S2}$ and also are formed together as a monolithic structure of single piece. A drain 224 of the second driving TFT $T_{D2}$ is connected to both the drain 212 of the first switching TFT $T_{S1}$ and the source 216 of the second switching TFT $T_{S2}$. A source 222 of the first driving TFT $T_{D1}$ and a source 226 of the second driving TFT $T_{D2}$ are both connected to a power line 206. Further more, a drain 228 of the first driving TFT $T_{D1}$ is connected to an organic electroluminescent diode E. A first storage capacitor $C_{ST1}$ is formed between the two gates 220 and 221 and the two sources 222 and 226.

In the above-mentioned driving unit, when the first and second switching TFTs $T_{S1}$ and $T_{S2}$ are turned on, the first and second driving TFTs $T_{D1}$ and $T_{D2}$ are also turned on and then a current signal flowing in the power line 206 is delivered to the organic electroluminescent diode E through the first driving TFT $T_{D1}$. As a result, the organic elecroluminescent diode E emits light.

The second driving unit will now be explained with reference to FIG. 5. In FIG. 5 of the present invention, the second driving unit is illustrated by dotted lines. As mentioned before, the second driving unit includes the parallel-connected third and fourth switching TFTs $T_{S3}$ and $T_{S4}$ and the parallel-connected third and fourth driving TFTs $T_{D3}$ and $T_{D4}$. Gates 230 and 242 of the third and fourth switching TFTs $T_{S3}$ and $T_{S4}$ are connected to the gate line 202, respectively. A source 232 of the third switching TFT $T_{S3}$ is connected to the data line 204 and a drain 234 of the third switching TFT $T_{S3}$ is connected to a source 244 of the fourth switching TFT $T_{S4}$. The drain 234 and the source 244 are formed together as a monolithic structure of single piece. A gate 236 of the third driving TFT $T_{D3}$ and a gate 237 of the fourth driving TFT $T_{D4}$ are connected to the drain 246 of the fourth switching TFT $T_{S4}$ and also formed together as a monolithic structure of single piece. A drain 240 of the fourth driving TFT $T_{D4}$ is connected to both the drain 234 of the third switching TFT $T_{S3}$ and the source 244 of the fourth switching TFT $T_{S4}$. A source 238 of the third driving TFT $T_{D3}$ and a source 248 of the fourth driving TFT $T_{D4}$ are both connected to a power line 206. Furthermore, a drain 250 of the third driving TFT $T_{D3}$ is connected to an organic electroluminescent diode E. A second storage capacitor $C_{ST2}$ is formed between the two gates 236 and 237 and the two sources 238 and 248.

The second driving unit comprised of the third and fourth switching TFTs $T_{S3}$ and $T_{S4}$ and the third and fourth driving TFTs $T_{D3}$ and $T_{D4}$ is actually a backup circuit that does not operate when the organic electroluminescent diode E emits light by the proper operation of the first driving unit (i.e., the first and second switching TFTs $T_{S1}$ and $T_{S2}$ and the first and second driving TFTs $T_{D1}$ and $T_{D2}$). Therefore, a first open portion C between the power line 206 and the source 238 of the third driving TFT $T_{D3}$ is opened, and a second open portion D between the data line 204 and the source 232 of the third switching TFT $T_{S3}$ is also opened. The first and second open portions C and D are designed to be opened together at the first stage of fabricating the organic electroluminescent display device.

Therefore, the second driving unit does not properly operate at the first time by cutting off the TFTs from communication with the source lines (i.e., the data and power lines). However, when the first driving unit has some defects and malfunctions, the open portions C and D are closed by welding or the like to connect the power line 206 to the third driving TFT $T_{D3}$ and the data line 204 to the third switching TFT $T_{S3}$. And thus the second driving unit operates instead of the first driving unit. At this time, a portion F between the data line 204 and the source of the first switching TFT $T_{S1}$ is opened to surely disconnect the first driving unit from the data line 204. As a result of the disconnection of the portion F, the organic electroluminescent diode E is not influenced by the first driving unit.

When the second driving unit operates instead of the first driving unit, the third and fourth switching TFTs $T_{S3}$ and $T_{S4}$ are turned on, and then the third and fourth driving TFTs $T_{D3}$ and $T_{D4}$ are also turned on, thereby delivering a current signal flowing in the power line 206 to the organic electroluminescent diode E through the third driving TFT $T_{D3}$. Therefore, the organic electroluminescent diode E emits light.

As mentioned before, opening the portion F between the data line 204 and the first switching TFT $T_{S1}$ results in the ability to stably supply the power line signal from the power line 206 to the organic electroluminescent diode E via only the second driving unit without any interruption by the first driving unit. If the portion F is not cut open, the power line signal may flow into the organic electroluminescent diode E through the first driving unit as well, which would deteriorate the image quality of the organic electroluminescent display device. Accordingly, when the second driving unit is set to replace the first driving unit by welding shut the open portions C and D, the portion F between the data line 204 and the first switching TFT $T_{S1}$ is opened.

In the above-mentioned organic electroluminescent display device, the switching and/or driving TFTs can be p-type or n-type. If p-type TFTs are used for the driving TFT, the electrode contacting the power line 106 or 206 can be a drain and the electrode contacting the organic electroluminescent diode E can be a source.

In the present invention, it is distinguishable that the backup circuit is included in the pixel of the organic electroluminescent display device. Furthermore, the inventive structure including the backup circuits can be adopted, for example, to the active matrix type organic electroluminescent display device and particularly to the top emission type organic electroluminescent display device. The top emission type organic electroluminescent display device emits light in a direction away from the TFTs and arrays so that it can be easily designed to have a high aperture ratio. As an example of the top emission type organic electroluminescent display device, the organic electroluminescent display device having a dual plate structure (i.e., Dual Plate LED:DPLDE) is introduced.

Figure 6:
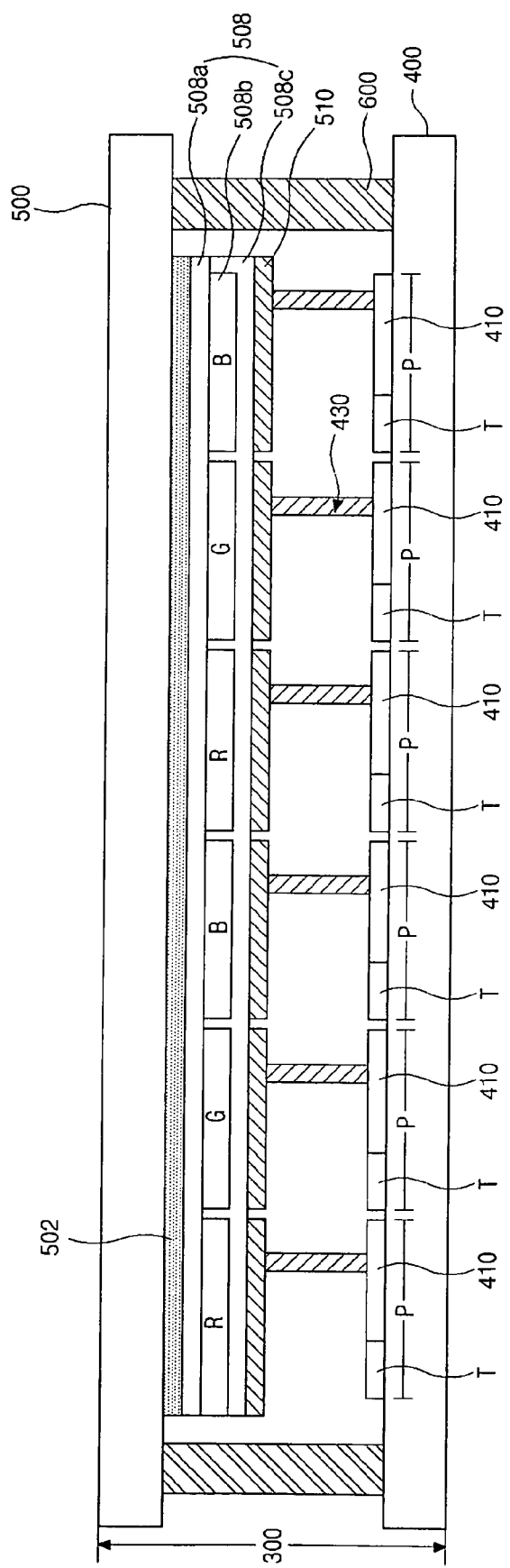
FIG. 6 is a schematic cross-sectional view illustrating an active matrix type organic electroluminescent display device according to the present invention.

FIG. 6 is a schematic cross-sectional view illustrating an active matrix type organic electroluminescent display device having a dual plate structure according to the present invention. As shown in FIG. 6, an organic electroluminescent display device 300 of the present invention includes a first substrate 400 and a second substrate 500 which are attached to each other by a sealant 600. On a front surface of the first substrate 400, a plurality of pixels P are defined and disposed. Each pixel P includes TFT portion T that has switching and driving thin film transistors, and array portion 410 that has a plurality of lines and other array elements.

On a rear surface of the second substrate 500, a first electrode 502 is disposed. The first electrode 502 is made of a transparent material, e.g., indium tin oxide, and injects the holes to an organic luminous layer 508. A second electrode 510 is formed on the organic luminous layer 508 so that the organic luminous layer 508 is disposed between the first and second electrodes 502 and 510. The organic luminous layer 508 can be comprised of monolayer or multilayer. When the organic luminous layer 508 has the multilayer structure, the organic luminous layer 508 includes a hole transporting layer 508a, an emission layer 508b and an electron transporting layer 508c in sequential order from the first electrode 502. The second electrode 510 electrically communicates with the TFT portion T through a electrical connector 430. The first substrate 400 is usually fabricated to have the electrical connector 430 and then the second substrate 500, including the organic luminous layer 508 and the first and second electrodes 502 and 510, is attached to the first substrate 400. Thus, the electrical connector 430 connects the switching and driving TFTs T to the second electrode 510 that injects the electrons to the organic luminous layer 508.

According to the present invention, the inventive dummy circuits shown in FIGS. 4 and 5 can be adopted to the TFT portions T of FIG. 6. In the present invention, since the organic electroluminescent display device includes backup driving circuits, if the switching and/or driving TFTs have defects or malfunctions, the backup driving circuits can be substituted to avoid poor image quality that would otherwise result in being displayed from such defects or malfunctions. Therefore, a point defect in the pixel, for example, a dark spot, can be prevented from being displayed in accordance with the present invention. As a result, the organic electroluminescent display device of the instant invention provides a superior picture quality.

It will be apparent to those skilled in the art that various modifications and variations can be made in the organic electroluminescent device of the present invention without departing from the spirit or scope of the invention. Thus, it is intended that the present invention cover the modifications and variations of this invention provided they come within the scope of the appended claims and their equivalents.

What is claimed is:

1. An organic electroluminescent device, comprising:
a gate line and a data line formed over a substrate, the gate and data lines perpendicularly crossing each other and defining a pixel therebetween;
a first driving unit formed in the pixel and comprised of a first switching TFT and a first driving TFT;
a power line delivering a current signal to the first driving TFT;
an organic electroluminescent diode contacting the first driving TFT and receiving the current signal from the first driving TFT; and
a second driving unit formed in the pixel and comprised of a second switching TFT and a second driving TFT, the second driving unit being a backup circuit that can deliver the current signal from the power line to the organic electroluminescent diode when the first driving unit malfunctions, wherein the first and second driving units are connected in parallel.

2. The device of claim 1, wherein the first switching TFT comprises:
a gate connected to the gate line;
a source connected to the data line; and
a drain connected to a gate of the first driving TFT,
wherein the first driving TFT comprises:
the gate connected to the drain of the first switching TFT;
a source connected to the power line; and
a drain connected to the organic electroluminescent diode,
wherein the second switching TFT comprises:
a gate connected to the gate line;
a source connected to the data line; and
a drain connected to a gate of the second driving TFT, and
wherein the second driving TFT comprises:
the gate connected to the drain of the second switching TFT;
a source connected to the power line; and
a drain connected to the organic electroluminescent diode.

3. The device of claim 2, further comprising a first storage capacitor that is connected in parallel to the first driving TFT and a second storage capacitor that is connected in parallel to the second driving TFT.

4. The device of claim 3, wherein the first storage capacitor is formed between the gate of the first driving TFT and the source of the first driving TFT.

5. The device of claim 2, further comprising an open portion between the power line and the source of the second driving TFT, wherein the open portion electrically separates the second driving TFT from the power line at the first stage of fabricating the organic electroluminescent device and then is closed to electrically connect the power line to the second driving TFT when the first driving unit malfunctions.

6. The device of claim 5, wherein a portion between the power line and the source of the first driving TFT is cut open when the open portion becomes closed, thereby disconnecting the first driving unit so that only the second driving unit can operate.

7. The device of claim 3, wherein the second storage capacitor is formed between the gate of the second driving TFT and the source of the second driving TFT.

8. The device of claim 7, wherein the second storage capacitor includes the gate of the second driving TFT and the power line.

9. The device of claim 4, wherein the first storage capacitor includes the gate of the first driving TFT and the power line.

10. The device of claim 1, wherein the organic electroluminescent diode includes an anode electrode, a cathode electrode and an organic luminous layer between the anode and cathode electrodes.

11. The device of claim 10, wherein the anode electrode is transparent and the organic luminous layer includes a hole transporting layer, an emission layer and an electron transporting layer in sequential order from the anode electrode.

12. An organic electroluminescent device, comprising:
a gate line and a data line formed over a substrate, the gate and data lines perpendicularly crossing each other and defining a pixel therebetween;
a first driving unit formed in the pixel and comprised of first and second switching TFTs and first and second driving TFTs;
a power line delivering a current signal to the first driving TFT;
an organic electroluminescent diode contacting the first driving TFT and receiving the current signal from the first driving TFT; and
a second driving unit formed in the pixel and comprised of third and fourth switching TFTs and third and fourth driving TFTs, the second driving unit being a backup circuit that can deliver the current signal from the power line to the organic electroluminescent diode when the first driving unit malfunctions.

13. The device of claim 12, wherein the first switching TFT comprises:
a gate connected to the gate line;
a source connected to the data line; and
a drain connected to a source of the second switching TFT,
wherein the second switching TFT comprises:
a gate connected to the gate line;
the source connected to the drain of the first switching TFT; and
a drain connected to gates of the first and second driving TFTs,
wherein the first driving TFT comprises:
the gate connected to the source of the second switching TFT;
a source connected to the power line; and
a drain connected to the organic electroluminescent diode,
wherein the second driving TFT comprises:
the gate connected to the drain of the second switching TFT;
a source connected to the power line; and
a drain connected to both the drain of the first switching TFT and the source of the second switching TFT,
wherein the third switching TFT comprises:
a gate connected to the gate line;
a source connected to the data line; and
a drain connected to a source of the fourth switching TFT,
wherein the fourth switching TFT comprises:
a gate connected to the gate line;
the source connected to the drain of the third switching TFT; and
a drain connected to gates of the third and fourth driving TFTs,
wherein the third driving TFT comprises:
the gate connected to the drain of the fourth switching TFT;
a source connected to the power line; and
a drain connected to the organic electroluminescent diode, and
wherein the fourth driving TFT comprises:
the gate connected to the drain of the fourth switching TFT;
a source connected to the power line; and
a drain connected to both the drain of the third switching TFT and the source of the fourth switching TFT.

14. The device of claim 13, further comprising a first storage capacitor that is connected in parallel to the first and second driving TFTs and a second storage capacitor that is connected in parallel to the third and fourth driving TFTs.

15. The device of claim 14, wherein the first storage capacitor is formed between the gates of the first and second driving TFTs and the sources of the first and second driving TFTs.

16. The device of claim 15, wherein the first storage capacitor includes the gates of the first and second driving TFTs and the power line.

17. The device of claim 14, wherein the second storage capacitor is formed between the gates of the third and fourth driving TFTs and the sources of the third and fourth driving TFTs.

18. The device of claim 17, wherein the second storage capacitor includes the gates of the third and fourth driving TFTs and the power line.

19. The device of claim 13, wherein the drain of the first switching TFT and the source of the second switching TFT are formed together as a single piece monolithic structure.

20. The device of claim 13, wherein the gates of the first and second driving TFTs are formed together as a single piece monolithic structure.

21. The device of claim 13, wherein the drain of the third switching TFT and the source of the fourth switching TFT are formed together as a single piece monolithic structure.

22. The device of claim 13, wherein the gates of the third and fourth driving TFTs are formed together as a single piece monolithic structure.

23. The device of claim 13, further comprising a first open portion between the power line and the source of the third driving TFT and a second open portion between the data line and the source of the third switching TFT, wherein the first open portion electrically separates the third driving TFT from the power line at the first stage of fabricating the organic electroluminescent device and then is closed to electrically connect the power line to the third driving TFT when the first driving unit malfunctions, and wherein the second open portion electrically separates the third switching TFT from the data line at the first stage of fabricating the organic electroluminescent device and then is closed to electrically connect the data line to the third switching TFT when the first driving unit malfunctions.

24. The device of claim 23, wherein a portion between the data line and the source of the first switching TFT is cut open when the first and second open portions become closed, thereby disconnecting the first driving unit so that only the second driving unit can operate.

25. The device of claim 12, wherein the organic electroluminescent diode includes an anode electrode, a cathode electrode and an organic luminous layer between the anode and cathode electrodes.

26. The device of claim 25, wherein the anode electrode is transparent and the organic luminous layer includes a hole transporting layer, an emission layer and an electron transporting layer in sequential order from the anode electrode.

* * * * *